(12) United States Patent
Lin et al.

(10) Patent No.: US 12,402,279 B2
(45) Date of Patent: Aug. 26, 2025

(54) HEAT DISSIPATION STRUCTURE AND ELECTRONIC DEVICE

(71) Applicant: Acer Incorporated, New Taipei (TW)

(72) Inventors: Kuang-Hua Lin, New Taipei (TW); Wen-Neng Liao, New Taipei (TW); Cheng-Wen Hsieh, New Taipei (TW); Tsung-Ting Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 17/832,707

(22) Filed: Jun. 6, 2022

(65) Prior Publication Data
US 2022/0400582 A1 Dec. 15, 2022

(30) Foreign Application Priority Data
Jun. 11, 2021 (TW) ................................ 110121330

(51) Int. Cl.
*H05K 7/20* (2006.01)

(52) U.S. Cl.
CPC ..... *H05K 7/20336* (2013.01); *H05K 7/20318* (2013.01); *H05K 7/205* (2013.01)

(58) Field of Classification Search
CPC ........... H05K 7/20509; H05K 7/20336; H05K 7/20309; H05K 7/205; H05K 7/2039; H05K 7/20318; H05K 7/20518
See application file for complete search history.

(56) References Cited

U.S. PATENT DOCUMENTS

| | | | |
|---|---|---|---|
| 7,885,067 B2 * | 2/2011 | Sakata | H05K 7/2099 165/104.33 |
| 7,965,512 B2 * | 6/2011 | Huang | F28F 1/24 165/104.33 |
| 10,103,692 B2 * | 10/2018 | Patel | H05K 1/183 |
| 2008/0198550 A1 * | 8/2008 | Wang | H01L 23/4006 257/E23.084 |
| 2019/0103290 A1 * | 4/2019 | Medina | F28D 15/0275 |
| 2020/0292243 A1 * | 9/2020 | Liu | F28D 15/0233 |
| 2021/0384104 A1 * | 12/2021 | Doria | H01L 23/4006 |
| 2022/0015258 A1 * | 1/2022 | Manninen | H01L 23/427 |
| 2022/0354028 A1 * | 11/2022 | Verhoog | H05K 7/20263 |

FOREIGN PATENT DOCUMENTS

| | | |
|---|---|---|
| CN | 204119707 | 1/2015 |
| CN | 112050672 | 12/2020 |

\* cited by examiner

*Primary Examiner* — Jayprakash N Gandhi
*Assistant Examiner* — Matthew Sinclair Muir
(74) *Attorney, Agent, or Firm* — JCIPRNET

(57) ABSTRACT

Provided is a heat dissipation structure, including a conductive member disposed on and thermally coupled to a heat source, a heat pipe including evaporating and condensing parts, a fan disposed in correspondence to the condensing part, and a heat storage component disposed on a circuit board. The evaporating part is disposed on and thermally coupled to the conductive member. The heat source is located between the conductive member and the circuit board. The conductive member is located between the heat pipe and the heat source. The circuit board is located between the heat source and the heat storage component, and is thermally coupled to the heat source. The heat storage component is thermally coupled to the circuit board and is filled with a working medium absorbing heat conducted from the heat source to the circuit board by latent heat of absorption during phase change. An electronic device is also provided.

10 Claims, 4 Drawing Sheets

HEAT DISSIPATION STRUCTURE AND ELECTRONIC DEVICE

CROSS-REFERENCE TO RELATED APPLICATION

This application claims the priority benefit of Taiwan application serial no. 110121330, filed on Jun. 11, 2021. The entirety of the above-mentioned patent application is hereby incorporated by reference herein and made a part of this specification.

BACKGROUND

Technical Field

The disclosure relates to a heat dissipation structure and an electronic device, and more particularly to a heat dissipation structure and an electronic device using the heat dissipation structure.

Description of Related Art

With continuous improvements in computing performance of electronic devices, related manufacturers have been focusing on how to rapidly extract heat generated during operation of central processing units or graphics processing units inside the electronic devices.

Generally speaking, the central processing unit or the graphics processing unit is connected to the circuit board, and the heat is extracted out by a remote heat exchanger (RHE), which transfers the heat sequentially through a conductive member thermally coupled to the surface of the central processing unit or the graphics processing unit and a heat pipe connected to the conductive member to a heat dissipation fin connected to the heat pipe, and finally dissipates the heat out of the system by heat exchange with the outside through forced convection provided by a fan.

However, when the electronic device generates high-wattage transient power, relatively high thermal energy is generated instantly, and the existing RHE is unable to provide effective heat dissipation to the instantly generated relatively high thermal energy due to its heat dissipation rate.

SUMMARY

The disclosure provides a heat dissipation structure, which helps enhance instant heat dissipation performance.

The disclosure provides an electronic appliance, which has excellent instant heat dissipation performance.

The disclosure proposes a heat dissipation structure, which includes a conductive member, at least one heat pipe, at least one fan, and at least one heat storage component. The conductive member is disposed on at least one heat source and is thermally coupled to the at least one heat source. The at least one heat pipe includes an evaporating part and a condensing part. The evaporation part of the at least one heat pipe is disposed on the conductive member and is thermally coupled to the conductive member. The at least one fan is disposed in correspondence to the condensing part of the at least one heat pipe. The at least one heat storage component is disposed on the circuit board. The at least one heat source is located between the conductive member and the circuit board. The conductive member is located between the at least one heat pipe and the at least one heat source. The circuit board is located between the at least one heat source and the at least one heat storage component. The circuit board is thermally coupled to the at least one heat source, and the at least one heat storage component is thermally coupled to the circuit board. The at least one heat storage component is filled with a working medium, and the working medium absorbs the heat conducted from the at least one heat source to the circuit board by latent heat of absorption during phase change.

The disclosure provides an electronic device, which includes a case, a circuit board, at least one heat source, and a heat dissipation structure. The circuit board is disposed in the case. The at least one heat source is disposed on the circuit board. The heat dissipation structure includes a conductive member, at least one heat pipe, at least one fan, and at least one heat storage component. The conductive member is disposed on the at least one heat source. The conductive member is thermally coupled to the at least one heat source, and the at least one heat source is located between the conductive member and the circuit board. The at least one heat pipe includes an evaporating part and a condensing part. The evaporation part of the at least one heat pipe is disposed on the conductive member and is thermally coupled to the conductive member. The conductive member is located between the at least one heat pipe and the at least one heat source. The at least one fan is disposed in correspondence to the condensing part of the at least one heat pipe. The at least one heat storage component is disposed on the circuit board and is thermally coupled to the circuit board. The circuit board is located between the at least one heat source and the at least one heat storage component. The circuit board is thermally coupled to the at least one heat source, and the at least one heat storage component is thermally coupled to the circuit board. The at least one heat storage component is filled with a working medium, and the working medium absorbs heat conducted from the at least one heat source to the circuit board by latent heat of absorption during phase change.

Based on the above, in the heat dissipation structure and the electronic device of the disclosure, the circuit board is thermally coupled to the heat source, the heat storage component is further thermally coupled to the circuit board, and the circuit board is located between the heat source and the heat storage component. When the heat source generates relatively high heat instantly, the working medium inside the heat storage component absorbs the heat conducted from the heat source to the circuit board by latent heat of absorption during the phase change, and thus has excellent instant heat dissipation performance.

In order to make the above-mentioned features and advantages of the present invention more comprehensible, the following specific embodiments are described in detail in conjunction with the accompanying drawings.

DESCRIPTION OF THE EMBODIMENTS

Figure 1:
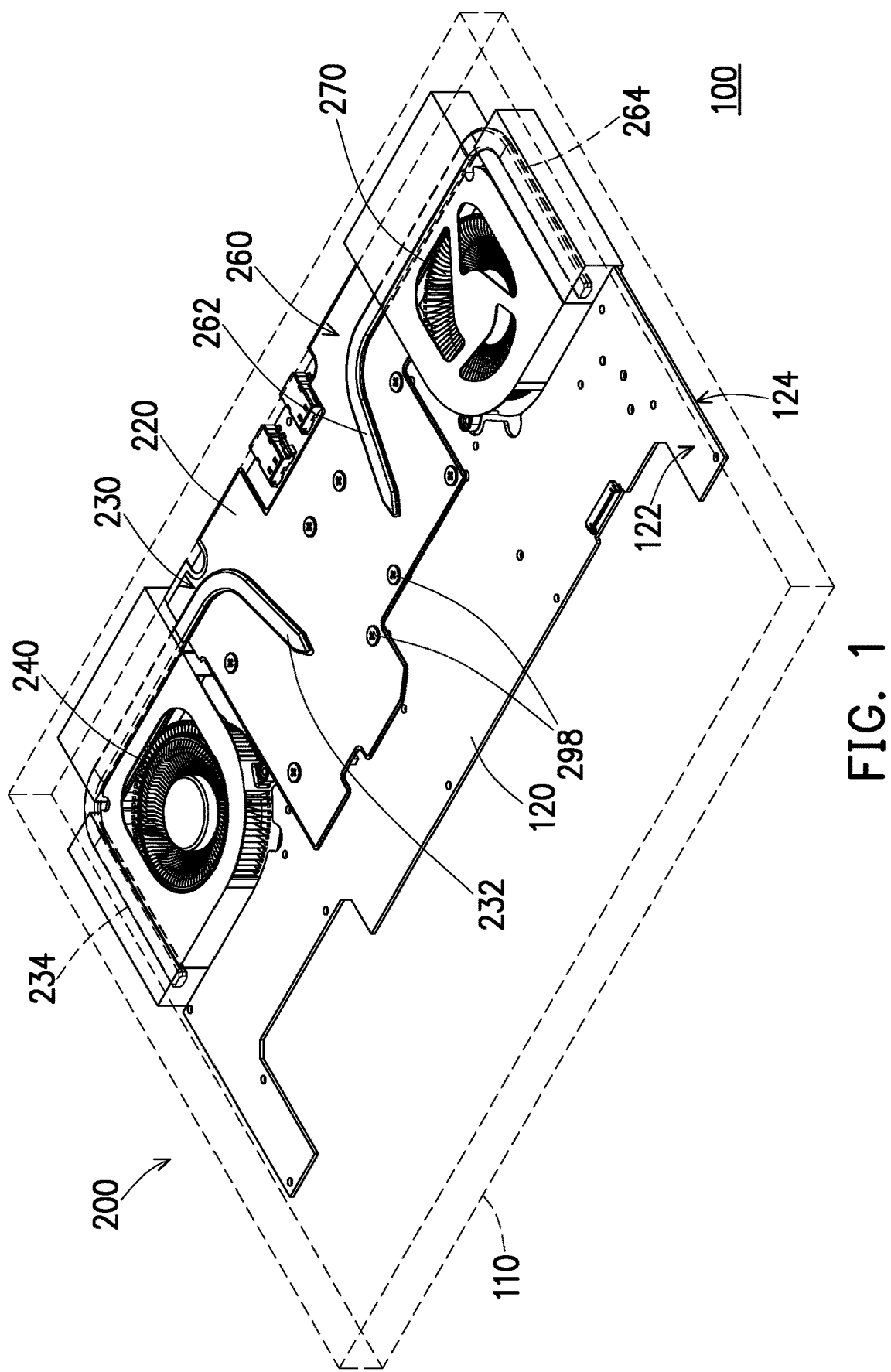
FIG. 1 is a schematic perspective view of an electronic device according to an embodiment of the disclosure.

FIG. 1 is a schematic perspective view of an electronic device according to an embodiment of the disclosure. FIG.

Figure 2:
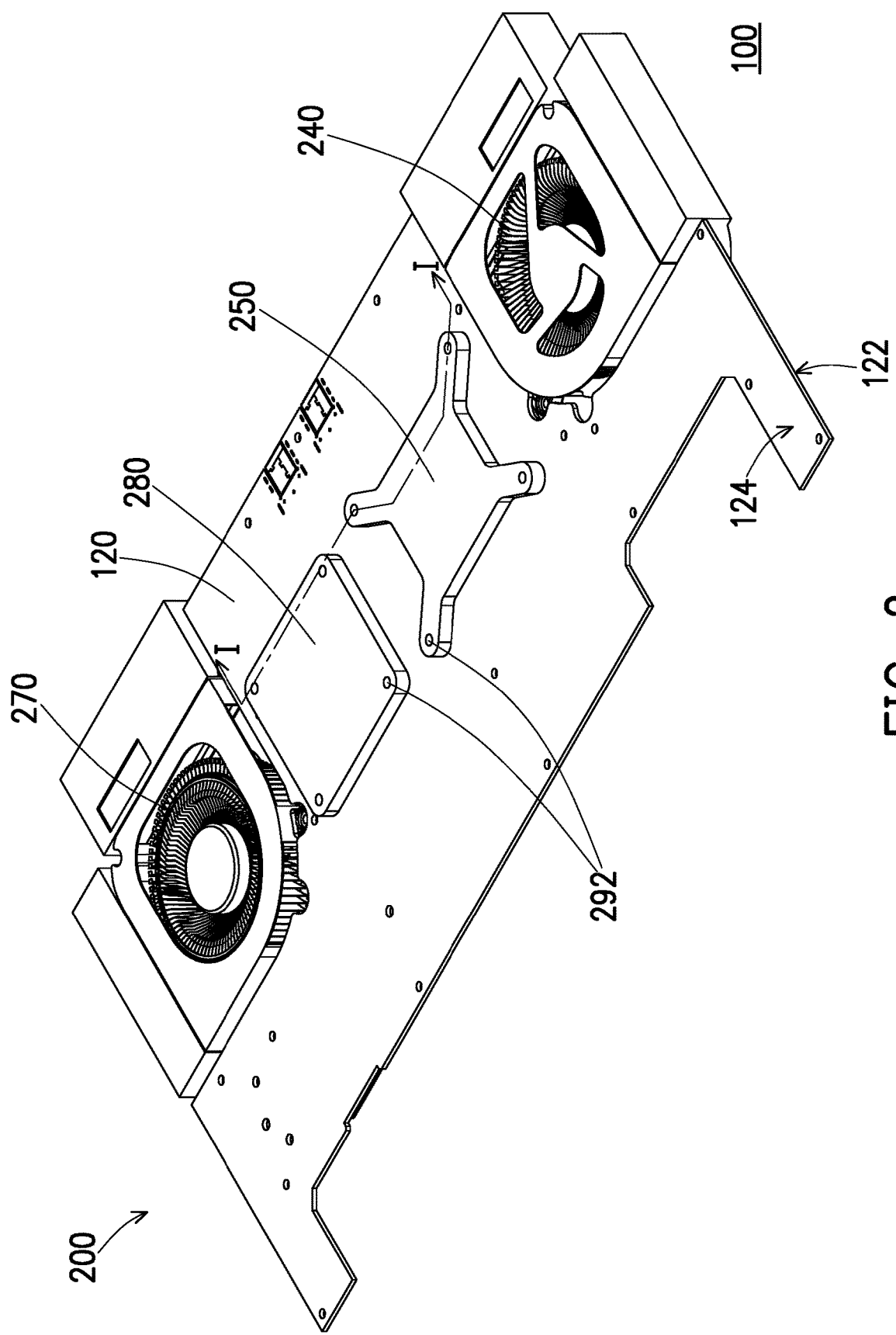
FIG. 2 is a schematic perspective view of the electronic device of FIG. 1 from another perspective.
Figure 3:
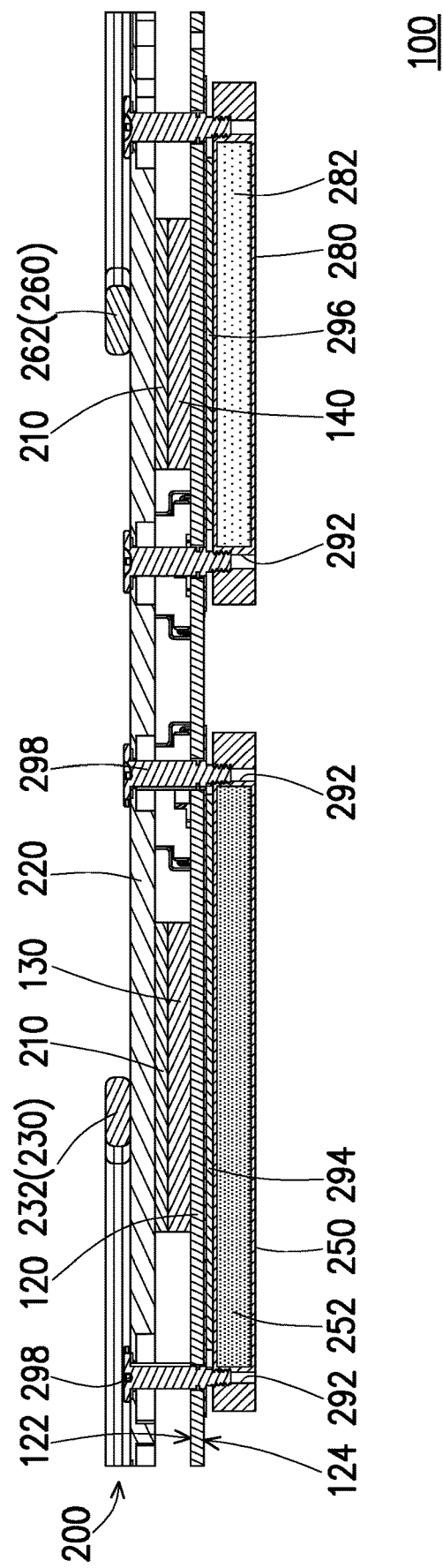
FIG. 3 is a schematic cross-sectional view of partial components of the electronic device of FIG. 2 taken along a section line I-I.

2 is a schematic perspective view of the electronic device of FIG. 1 from another perspective. FIG. 3 is a schematic cross-sectional view of partial components of the electronic device of FIG. 2 taken along a section line I-I. With reference to FIG. 1 to FIG. 3, in this embodiment, an electronic device 100 may be a part of a notebook computer (such as a host responsible for logical operations and data access) or other portable electronic device, and includes a case 110, a circuit board 120, and a heat dissipation structure 200. The circuit board 120 and the heat dissipation structure 200 are disposed in the case 110, and the heat dissipation structure 200 is disposed on the circuit board 120. Various electronic components are disposed on the circuit board 120, with its central processing unit (CPU) and graphics processing unit (GPU) as main heat sources. The heat dissipation structure 200 is thermally coupled to the main heat sources to rapidly extract the heat generated by the main heat sources out of the case 110 or to avoid the temperature inside the case 110 from rising sharply.

In detail, the electronic device 100 of this embodiment further includes a first heat source 130 and a second heat source 140. The first heat source 130 and the second heat source 140 are disposed on a first side 122 of the circuit board 120 and are thermally coupled to the circuit board 120, and the first heat source 130 and the second heat source 140 may be one of the CPU and the GPU, respectively. On the other hand, the heat dissipation structure 200 includes a conductive member 220, a first heat pipe 230, a first fan 240, a first heat storage component 250, a second heat pipe 260, a second fan 270, and a second heat storage component 280. The conductive member 220 may be composed of copper, aluminum, or other high thermal conductivity material, and is thermally coupled to the first heat source 130 and the second heat source 140 to extract out the heat generated by the first heat source 130 and the second heat source 140, so as to provide a first heat dissipation path for the first heat source 130 and the second heat source 140.

It should be noted that the terms "first" and "second" mentioned in the disclosure are only used to distinguish different components and structures to facilitate intuitive understanding and reading, and are not intended to limit the disclosure.

In detail, the conductive member 220 is disposed on the first heat source 130 and the second heat source 140, and is located on the first side 122 of the circuit board 120. The first heat source 130 is located between the conductive member 220 and the circuit board 120, and the second heat source 140 is located between the conductive member 220 and the circuit board 120.

The first heat pipe 230 includes an evaporating part 232 and a condensing part 234, and the second heat pipe 260 includes an evaporating part 262 and a condensing part 264. The evaporation part 232 of the first heat pipe 230 and the evaporation part 262 of the second heat pipe 260 are disposed on the conductive member 220 and are thermally coupled to the conductive member 220. The conductive member 220 is located between the evaporation part 232 of the first heat pipe 230 and the first heat source 130, and the conductive member 220 is located between the evaporation part 262 of the second heat pipe 260 and the second heat source 140. The first fan 240 is disposed in correspondence to an air outlet of the condensing part 234 of the first heat pipe 230, and the second fan 270 is disposed in correspondence to an air outlet of the condensing part 264 of the second heat pipe 260.

Accordingly, the heat generated by the first heat source 130 may be conducted to the first heat pipe 230 through the conductive member 220, and the heat in the first heat pipe 230 may be extracted out of the case 110 by heat exchange with an airflow generated by the first fan 240. The heat generated by the second heat source 140 may be conducted to the second heat pipe 260 through the conductive member 220, and the heat in the second heat pipe 260 may be extracted out of the case 110 by heat exchange with an airflow generated by the second fan 270.

Furthermore, the heat dissipation structure 200 further includes multiple first heat dissipation pastes 210, which may employ liquid copper heat dissipation pastes, but the disclosure is not limited thereto. These first heat dissipation pastes 210 are disposed between the conductive member 220 and the first heat source 130 and between the conductive member 220 and the second heat source 140. The conductive member 220 is thermally coupled to the first heat source 130 and the second heat source 140 through these first heat dissipation pastes 210, and is fixed to the first heat source 130 and the second heat source 140 through these first heat dissipation pastes 210.

In this embodiment, the first heat storage component 250 and the second heat storage component 280 are disposed on a second side 124 of the circuit board 120 and are thermally coupled to the circuit board 120. In other words, the circuit board 120 is located between the first heat source 130 and the first heat storage component 250, and the circuit board 120 is located between the second heat source 140 and the second heat storage component 280.

The heat generated by the first heat source 130 is conducted from the first side 122 of the circuit board 120 to the conductive member 220, then further conducted to the circuit board 120, and finally conducted to the first heat storage component 250 through the second side 124 of the circuit board 120. Similarly, the heat generated by the second heat source 140 is conducted from the second side 124 of the circuit board 120 to the conductive member 220, then further conducted to the circuit board 120, and finally conducted to the second heat storage component 280 through the second side 124 of the circuit board 120, so as to provide a second heat dissipation path for the first heat source 130 and the second heat source 140.

In detail, the first heat storage component 250 may be a hollow case body composed of copper, aluminum, or other high thermal conductivity material, and the first heat storage component 250 may be filled with a first working medium 252. The second heat storage component 280 may be a hollow case body composed of copper, aluminum, or other high thermal conductivity material, and the second heat storage component 280 may be filled with a second working medium 282. Among them, the first working medium 252 and the second working medium 282 may be phase change materials (PCM).

When the first heat source 130 generates high-wattage transient power instantly, the first heat dissipation path of the heat dissipation structure 200 is unable to rapidly provide heat dissipation to the first heat source 130, so the heat is conducted to the first heat storage component 250 through the second heat dissipation path. After the first working medium 252 absorbs enough heat to reach a phase change temperature, the first working medium 252 undergoes a phase change and instantly absorbs the heat conducted from the first heat source 130 to the circuit board 120 by latent heat of absorption during the phase change. Therefore, the heat dissipation structure 200 of the disclosure has excellent instant heat dissipation performance.

Similarly, when the second heat source 140 generates high-wattage transient power instantly, the second heat dissipation path of the heat dissipation structure 200 is unable to rapidly provide heat dissipation to the second heat source 140, so the heat is conducted to the second heat storage component 280 through the second heat dissipation path. After the second working medium 282 absorbs enough heat to reach a phase change temperature, the second working medium 282 undergoes a phase change and instantly absorbs the heat conducted from the second heat source 140 to the circuit board 120 by latent heat of absorption during the phase change. In other words, the first working medium 252 and the second working medium 282 may store the latent heat by phase change and absorb the heat conducted from the first heat source 130 and the second heat source 140 to the circuit board 120 when storing the latent heat. Therefore, the heat dissipation structure 200 of the disclosure has excellent instant heat dissipation performance.

On the other hand, after the electronic device 100 is shut down, the first working medium 252 and the second working medium 282 release the latent heat by phase change. Since the electronic device 100 has been shut down at this time, the working performance of the electronic device 100 is not affected.

In this embodiment, the first working medium 252 and the second working medium 282 may employ 3M™ Fluorinert FC-72 electronic engineering liquid, which has a boiling point of 56° C. and requires to absorb 88 kJ/kg during phase change. In other words, the 3M™ Fluorinert FC-72 electronic engineering liquid may instantly absorb the heat conducted from the first heat source 130 and the second heat source 140 to the circuit board 120 by latent heat of evaporation during boiling (liquid-gas phase change). Since the boiling points of the first working medium 252 inside the first heat storage component 250 and the second working medium 282 inside the second heat storage component 280 are extremely low, the first working medium 252 and the second working medium 282 may instantly absorb a huge amount of heat and evaporate when reaching the boiling points to change from a liquid medium to a gaseous medium. This may solve the problem of relatively high heat instantly generated by the existing CPU or GPU due to an instant increase of transient power, avoiding the temperature inside the electronic device 100 from rising sharply.

When the heat generated by the first heat source 130 and/or the second heat source 140 decreases or the temperature inside the electronic device 100 decreases, the temperature inside the first heat storage component 250 and/or the second heat storage component 280 may decrease below the boiling points of the first working medium 252 and/or the second working medium 282. At this time, the gaseous medium returns to the liquid medium by condensation, and the released heat may be extracted out of the electronic device 100 through the first heat dissipation path.

In addition, the electronic engineering liquid has insulating properties. When the first heat storage component 250 or the second heat storage component 280 are accidentally broken and cause a leakage of the electronic engineering liquid, since the electronic engineering liquid is not conductive, there is no risk of short-circuiting and damaging the electronic components. Furthermore, the low boiling point of the electronic engineering liquid allows it to rapidly evaporate without leaving residues when an accidental leakage occurs.

In other embodiments, the working medium may employ 3M™ Fluorinert FC-87 electronic engineering liquid, which has a boiling point of 30° C. and requires to absorb 88 kJ/kg during phase change, 3M™ Fluorinert FC-84 electronic engineering liquid, which has a boiling point of 80° C. and requires to absorb 80 kJ/kg during phase change, 3M™ Fluorinert FC-77 electronic engineering liquid, which has a boiling point of 97° C. and requires to absorb 84 kJ/kg during phase change, or other phase change material such as a refrigerant.

It should be noted that the first heat source 130 and the second heat source 140 of this embodiment may be set at different working temperatures, and the first working medium 252 and the second working medium 282 may employ different phase change materials to respectively maintain the first heat source 130 and the second heat source 140 at the working temperatures. In other words, the temperatures at which the first working medium 252 and the second working medium 282 undergo a phase change are different from each other. That is, this embodiment employs various electronic engineering liquids having different boiling points to optimize heat dissipation efficiency in accordance with different temperatures generated by various heat sources.

In other embodiments, the first heat source and the second heat source are set at the same working temperature, and the first working medium and the second working medium may employ the same phase change material to maintain the first heat source and the second heat source at the same working temperature.

In other embodiments, the working medium may employ different phase change materials according to requirements and store latent heat by phase change absorbing the heat generated by the heat source other than the liquid-gas phase change generating heat of vaporization, such as solid-liquid phase change generating heat of fusion, solid-gas phase change generating heat of sublimation, or other phase change between two different solid phases, and the disclosure does not limit the method.

In this embodiment, the heat dissipation structure 200 further includes a second heat dissipation paste 294 and a third heat dissipation paste 296. The second heat dissipation paste 294 and the third heat dissipation paste 296 may employ liquid copper heat dissipation pastes, but the disclosure is not limited thereto. The second heat dissipation paste 294 is disposed between the circuit board 120 and the first heat storage component 250, and the third heat dissipation paste 296 is disposed between the circuit board 120 and the second heat storage component 280. The circuit board 120 is thermally coupled to the first heat storage component 250 and the second heat storage component 280 through the second heat dissipation paste 294 and the third heat dissipation paste 296, respectively.

In addition, the first heat storage component 250 and the second heat storage component 280 include multiple fastening holes 292. The heat dissipation structure 200 further includes multiple fastening members 298. The fastening member 298 is a screw, and the screw sequentially passes through the conductive member 220 and the circuit board 120 to be fastened to the fastening hole 292 of the first heat storage component 250 and the second heat storage component 280. In other words, in addition to providing the second heat dissipation path for the first heat source 130 and the second heat source 140, the first heat storage component 250 and the second heat storage component 280 may also be used for fastening purposes.

To put it another way, the disclosure replaces the traditional metal backplate with the first heat storage component 250 and the second heat storage component 280. In addition, the first heat storage component 250 and the second heat storage component 280 are thermally coupled to the second side 124 of the circuit board 120 so that the heat generated by the first heat source 130 and the second heat source 140 may be dissipated from the second side 124 of the circuit board 120 through the second heat dissipation path. Moreover, the first heat storage component 250 and the second heat storage component 280 have the function of the traditional metal backplate, which may avoid solder cracks or die cracks caused by excessive bending of the circuit board 120 when the first heat source 130 and the second heat source 140 are fastened to the conductive member 220 or other heat dissipation module. The first heat storage component 250 and the second heat storage component 280 may also enhance strength and balance of fastening the conductive member 220 or other heat dissipation module to reduce contact thermal resistance.

Figure 4:
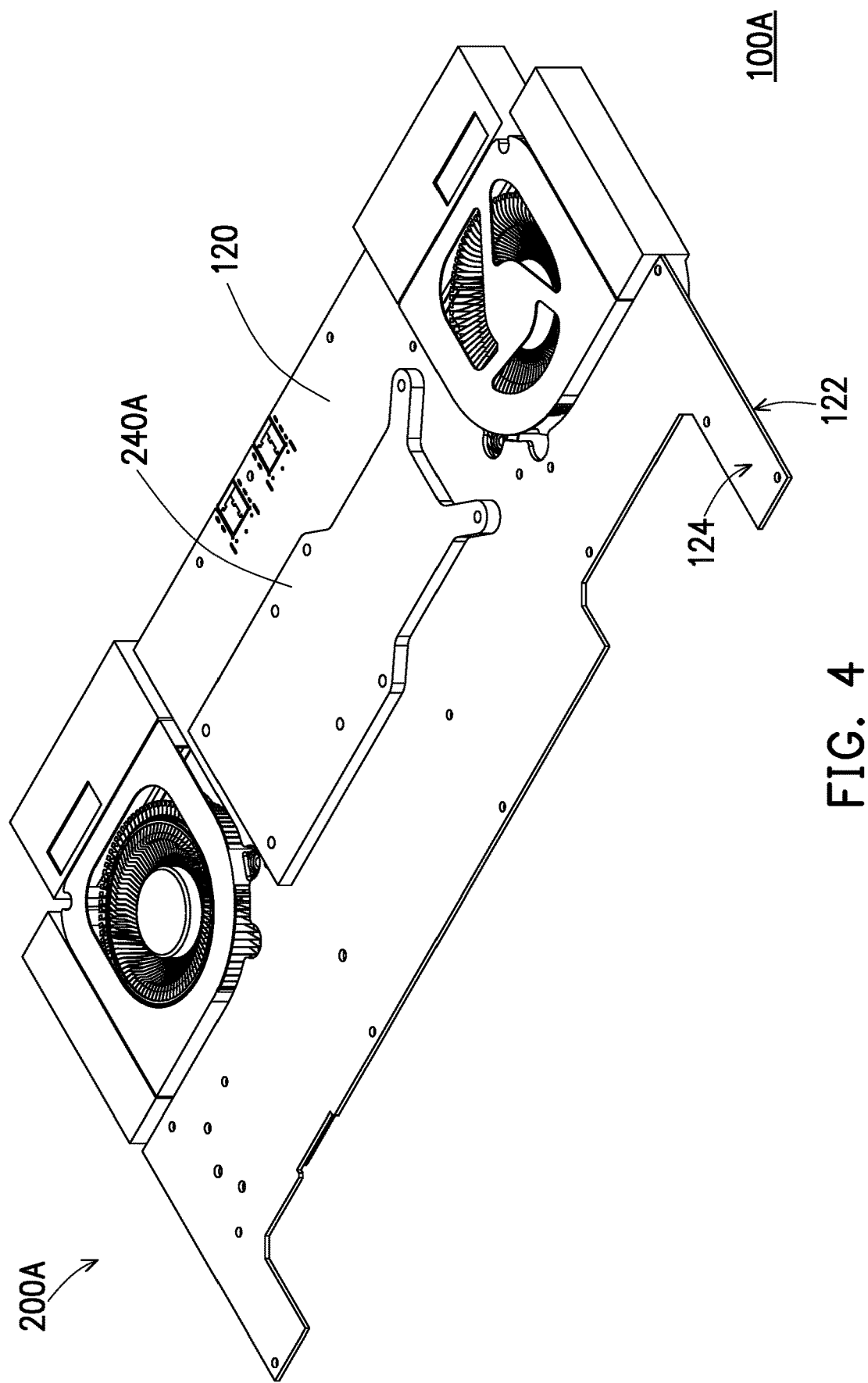
FIG. 4 is a schematic perspective view of an electronic device according to another embodiment of the disclosure.

FIG. 4 is a schematic perspective view of an electronic device according to another embodiment of the disclosure. With reference to FIG. 4, the difference between an electronic device 100A of this embodiment and the electronic device 100 of the previous embodiment lies in that a heat dissipation structure 200A of this embodiment provides a single heat storage component 240A, which may correspond to multiple heat sources. For example, the heat storage component 240A corresponds to the first heat source and the second heat source of the previous embodiment at the same time. The heat storage component 240A has a relatively huge volume and may be filled with more working medium to meet higher power consumption and heating requirements.

In summary, in the heat dissipation structure and the electronic device of the disclosure, the circuit board is thermally coupled to the heat source, the heat storage component is further thermally coupled to the circuit board, and the circuit board is located between the heat source and the heat storage component. When the heat source generates relatively high heat instantly, the working medium inside the heat storage component absorbs the heat conducted from the heat source to the circuit board by latent heat of absorption during the phase change, and thus has excellent instant heat dissipation performance.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A heat dissipation structure, comprising:
   a conductive member, disposed on at least one heat source and thermally coupled to the at least one heat source;
   at least one heat pipe, comprising an evaporation part and a condensing part, wherein the evaporation part of the at least one heat pipe is disposed on the conductive member and is thermally coupled to the conductive member;
   at least one fan, corresponding to the condensing part of the at least one heat pipe;
   at least one heat storage component, disposed on a circuit board, wherein the at least one heat source is located between the conductive member and the circuit board, the conductive member is located between the at least one heat pipe and the at least one heat source, and the circuit board is located between the at least one heat source and the at least one heat storage component, wherein the circuit board is thermally coupled to the at least one heat source, the at least one heat storage component is thermally coupled to the circuit board, the at least one heat storage component is filled with a working medium, and the working medium absorbs heat conducted from the at least one heat source to the circuit board by latent heat of absorption during phase change, the circuit board has a first side and a second side opposite to the first side, the at least one heat source via the conductive member, the at least one heat pipe and the at least one fan located on the first side to form a first heat dissipation path, the at least one heat source via the circuit board and the at least one heat storage component located on the second side to form a second heat dissipation path, and the heat generated by the at least one heat source is dissipated from the first heat dissipation path and the second heat dissipation path located on opposite two sides of the at least one heat source,
   under a first power, the heat is conducted to the at least one heat storage component through the second heat dissipation path, and the working medium filled in the at least one heat storage component undergoes phase change to absorb and store the heat conducted through the second heat dissipation path,
   until a temperature inside the at least one heat storage component decreases below a boiling point of the working medium, the heat stored in the working medium is unable to release,
   as the first power is decreased to a second power lower than the first power, the working medium undergoes phase change to release heat stored therein due to the temperature inside the at least one heat storage component decreasing below the boiling point of the working medium, and the heat released from the working medium is conducted to the first heat dissipation path.

2. The heat dissipation structure according to claim 1, wherein the number of the at least one heat source is a plurality, the number of the at least one heat storage component is a plurality in correspondence to the number of the heat sources, and each of the heat storage components is thermally coupled to a corresponding one of the heat sources.

3. The heat dissipation structure according to claim 2, temperatures at which the working media inside the heat storage components undergo phase change are different from each other.

4. The heat dissipation structure according to claim 1, wherein the number of the at least one heat source is a plurality, the number of the at least one heat storage component is one, and the heat storage component is thermally coupled to the heat sources.

5. The heat dissipation structure according to claim 1, wherein the at least one heat storage component comprises a plurality of fastening holes, the heat dissipation structure further comprises a plurality of fastening members, and the fastening members pass through the conductive member and the circuit board to be fastened to the fastening holes.

6. An electronic device, comprising:
   a case;
   a circuit board, disposed in the case;
   at least one heat source, disposed on the circuit board; and
   a heat dissipation structure, comprising:
      a conductive member, disposed on the at least one heat source and thermally coupled to the at least one heat source, wherein the at least one heat source is located between the conductive member and the circuit board;

at least one heat pipe, comprising an evaporating part and a condensing part, wherein the evaporating part of the at least one heat pipe is disposed on the conductive member and is thermally coupled to the conductive member, and the conductive member is located between the at least one heat pipe and the at least one heat source;

at least one fan, disposed in correspondence to the condensing part of the at least one heat pipe; and at least one heat storage component, disposed on the circuit board and thermally coupled to the circuit board, wherein the circuit board is located between the at least one heat source and the at least one heat storage component, the circuit board is thermally coupled to the at least one heat source, the at least one heat storage component is thermally coupled to the circuit board, the at least one heat storage component is filled with a working medium, and the working medium absorbs heat conducted from the at least one heat source to the circuit board by latent heat of absorption during phase change, the circuit board has a first side and a second side opposite to the first side, the at least one heat source via the conductive member, the at least one heat pipe and the at least one fan located on the first side to form a first heat dissipation path, the at least one heat source via the circuit board and the at least one heat storage component located on the second side to form a second heat dissipation path, and the heat generated by the at least one heat source is dissipated from the first heat dissipation path and the second heat dissipation path located on opposite two sides of the at least one heat source, under a first power, the heat is conducted to the at least one heat storage component through the second heat dissipation path, and the working medium filled in the at least one heat storage component undergoes phase change to absorb and store the heat conducted through the second heat dissipation path, until a temperature inside the at least one heat storage component decreases below a boiling point of the working medium, the heat stored in the working medium is unable to release, as the first power is decreased to a second power lower than the first power, the working medium undergoes phase change to release heat stored therein due to the temperature inside the at least one heat storage component decreasing below the boiling point of the working medium, and the heat released from the working medium is conducted to the first heat dissipation path.

7. The electronic device according to claim 6, wherein the number of the at least one heat source is a plurality, the number of the at least one heat storage component is a plurality in correspondence to the number of the heat sources, and each of the heat storage components is thermally coupled to a corresponding one of the heat sources.

8. The electronic device according to claim 7, temperatures at which the working media inside the heat storage components undergo phase change are different from each other.

9. The electronic device according to claim 6, wherein the number of the at least one heat source is a plurality, the number of the at least one heat storage component is one, and the heat storage component is thermally coupled to the heat sources.

10. The electronic device according to claim 6, wherein the at least one heat storage component comprises a plurality of fastening holes, the heat dissipation structure further comprises a plurality of fastening members, and the fastening members pass through the conductive member and the circuit board to be fastened to the fastening holes.

* * * * *